United States Patent
Zhang et al.

(10) Patent No.: US 10,483,486 B2
(45) Date of Patent: Nov. 19, 2019

(54) FRAME SEALING GLUE, DISPLAY PANEL AND DISPLAY DEVICE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Liang Zhang, Beijing (CN); Shanshan Bao, Beijing (CN); Fuyi Cui, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/551,900

(22) PCT Filed: Mar. 17, 2017

(86) PCT No.: PCT/CN2017/077085
§ 371 (c)(1),
(2) Date: Aug. 17, 2017

(87) PCT Pub. No.: WO2017/181792
PCT Pub. Date: Oct. 26, 2017

(65) Prior Publication Data
US 2018/0138444 A1    May 17, 2018

(30) Foreign Application Priority Data
Apr. 19, 2016    (CN) .................... 2016 2 0332870 U

(51) Int. Cl.
*H01L 51/52*    (2006.01)
*G02F 1/1339*    (2006.01)
*G02F 1/01*    (2006.01)

(52) U.S. Cl.
CPC ........ *H01L 51/5246* (2013.01); *G02F 1/0105* (2013.01); *G02F 1/1339* (2013.01); *H01L 51/52* (2013.01)

(58) Field of Classification Search
CPC . H01L 51/5246; H01L 51/52; H01L 51/0031; H01L 51/5259; H01L 51/56;
(Continued)

(56) References Cited

U.S. PATENT DOCUMENTS 7,169,636 B2 * 1/2007 Maruyama ............ H01L 51/524
349/73
8,063,561 B2 * 11/2011 Choi .................... H01L 51/5246
313/500
(Continued)

FOREIGN PATENT DOCUMENTS

| CN | 103500755 A | 1/2014 |
| CN | 103915573 A | 7/2014 |

(Continued)

OTHER PUBLICATIONS

International Search Report and Written Opinion from PCT Application Serial No. PCT/CN2017/077085, dated May 11, 2017, 19 pages.
(Continued)

*Primary Examiner* — Patricia L. Nordmeyer
(74) *Attorney, Agent, or Firm* — Kinney & Lange, P.A.

(57) ABSTRACT

A frame sealing glue includes a frame sealing glue body having an inner layer portion (211) and an outer layer portion (212). The frame sealing glue further includes an intermediate film layer (22) disposed between the inner layer portion (211) and the outer layer portion (212), and a plurality of enclosed spaces (P) are formed by the intermediate film layer (22) and the inner layer portion (211) or the outer layer portion (212) of the frame sealing glue body. A (Continued)

display panel and a display device are also provided. By means of the frame sealing glue, the display panel and the display device according to the embodiments of the present disclosure, it avoids a leakage phenomenon when the frame sealing glue is broken at different points, thereby increasing ability of the frame sealing glue for resisting external atmospheric pressure.

6 Claims, 4 Drawing Sheets

(58) Field of Classification Search
CPC ............. H01L 51/5243; H01L 51/5253; H01L 2251/568; H01L 33/62; H01L 33/32; H01L 33/38; H01L 33/486; H01L 33/56; H01L 25/0753; H01L 2924/01079; G02F 1/0105; G01N 21/81; G01N 31/222; H05K 999/99

See application file for complete search history.

(56) References Cited

U.S. PATENT DOCUMENTS

| | | | |
|---|---|---|---|
| 8,390,194 B2* | 3/2013 | Choi | ................... B32B 37/12 313/512 |
| 8,525,401 B2* | 9/2013 | Lee | ................... H01L 51/5246 313/495 |
| 9,728,740 B2* | 8/2017 | Kim | ................... H01L 51/5246 |
| 9,917,254 B2* | 3/2018 | Luo | ................... H05K 999/99 |
| 10,008,689 B2* | 6/2018 | Chang | ............... H01L 51/5246 |
| 2005/0227114 A1 | 10/2005 | Tanaka et al. | |
| 2006/0146265 A1 | 7/2006 | Park | |
| 2007/0097312 A1 | 5/2007 | Park et al. | |
| 2007/0120132 A1 | 5/2007 | Maruyama et al. | |
| 2007/0172971 A1* | 7/2007 | Boroson | ............. H01L 51/5246 438/26 |
| 2008/0151173 A1 | 6/2008 | Moon et al. | |
| 2009/0066903 A1 | 3/2009 | Yoshida et al. | |
| 2009/0289548 A1 | 11/2009 | Maruyama et al. | |
| 2010/0013384 A1 | 1/2010 | Song et al. | |
| 2010/0301743 A1 | 12/2010 | Kodama et al. | |
| 2012/0038269 A1 | 2/2012 | Maruyama et al. | |
| 2012/0119247 A1* | 5/2012 | Shih | .................... H01L 51/5246 257/99 |
| 2012/0248950 A1* | 10/2012 | Niibori | ................... C03C 27/06 312/223.1 |
| 2012/0299025 A1 | 11/2012 | Maruyama et al. | |
| 2014/0063432 A1 | 3/2014 | Yamazaki et al. | |
| 2016/0035996 A1 | 2/2016 | Sun et al. | |
| 2016/0188070 A1 | 6/2016 | Ko et al. | |
| 2017/0010490 A1 | 1/2017 | Li et al. | |
| 2017/0012236 A1 | 1/2017 | Yu | |
| 2017/0179427 A1 | 6/2017 | Yu | |
| 2017/0227800 A1 | 8/2017 | Yamazaki et al. | |
| 2017/0282495 A1* | 10/2017 | Zhang | ...................... B32B 7/02 |

FOREIGN PATENT DOCUMENTS

| | | |
|---|---|---|
| CN | 104932154 A | 9/2015 |
| CN | 105140420 A | 12/2015 |
| CN | 105206759 A | 12/2015 |
| CN | 205723639 U | 11/2016 |
| EP | 2980635 A1 | 3/2016 |
| JP | 10123537 A | 5/1998 |
| JP | 2001166125 A | 6/2001 |
| JP | 2005338886 A | 12/2005 |
| JP | 2008158524 A | 7/2008 |
| WO | WO2007/087157 A1 | 8/2007 |

OTHER PUBLICATIONS

Extended European Search Report received Dec. 10, 2018 for corresponding European Application No. 17749592.6.

\* cited by examiner

FRAME SEALING GLUE, DISPLAY PANEL AND DISPLAY DEVICE

CROSS-REFERENCE TO RELATED APPLICATION

This application is a Section 371 National Stage Application of International Application No. PCT/CN2017/077085, filed on Mar. 17, 2017, entitled "FRAME SEALING GLUE, DISPLAY PANEL AND DISPLAY DEVICE", which claims priority to Chinese Patent Application No. 201620332870.3 filed on Apr. 19, 2016 with SIPO, incorporated herein by reference in their entirety.

BACKGROUND

Technical Field

Embodiments of the present disclosure relate to the field of display technology, and more particularly, to a frame sealing glue, a display panel and a display device.

Description of the Related Art

Organic Light-Emitting Diode (OLED) is considered as an emerging application technology for the next generation of flat-panel displays as it has some advantages, such as self-luminescence, no backlight source, high contrast, lower thickness, wide viewing angle, fast response speed, application for flexible display panel, applicability at a wide temperature range, and simple construction and manufacturing process.

Thin Film Transistor Liquid Crystal Display (TFT-LCD) is a kind of active matrix type liquid crystal display, and has become a prevalent product. The traditional TFT-LCD is formed by filling liquid crystal into a cell assembled by a TFT array substrate and an opposite substrate. The opposite substrate may be made into a traditional color film (CF) substrate, or alternatively, a color film may be produced on the array substrate by COA (CF On Array, i.e., a color film is produced on an array substrate) process. A sealing assembly is an important step in the preparation processes of the TFT-LCD.

In general, no matter if a TFT-LCD display panel or an OLED display panel is utilized, a sealing assembly is needed. In order to ensure normal usage of the display panel in a variety of environments, especially in high temperature and high humidity environments, it is necessary to prevent water molecules or air from entering into display areas through sealing materials and corroding a display element and thus resulting in poor displaying. To this end, frame sealing glue is used to implement the sealing assembly.

For example, as for the OLED display panel, a frame sealing glue having a two-layer structure and formed from an ultraviolet-curable glue is typically used to implement the sealing assembly. When the ultraviolet-curable glue having a two-layer structure is broken at any point, it will cause the OLED device to be not airtight and external water vapor or air can enter into the display area, resulting in damage to the OLED device.

Thus, in the prior art, it will cause leakage phenomenon if the frame sealing glue structure is broken at different points, thereby reducing the ability of the frame sealing glue of resisting external atmospheric pressure.

SUMMARY

In an embodiment of the present disclosure, there is provided a frame sealing glue, comprising a frame sealing glue body having an inner layer portion and an outer layer portion, wherein the frame sealing glue further comprises an intermediate film layer disposed between the inner layer portion and the outer layer portion, and a plurality of enclosed spaces are formed by the intermediate film layer and the inner layer portion or the outer layer portion of the frame sealing glue body.

In one possible embodiment, the intermediate film layer is formed from a same material as the frame sealing glue body.

In one possible embodiment, the intermediate film layer comprises a wave-shaped curve line, and a peak and a valley of the curve line intersect with the inner layer portion and the outer layer portion of the frame sealing glue body respectively, or a peak and a valley of the curve line intersect with the outer layer portion and the inner layer portion of the frame sealing glue body respectively.

In one possible embodiment, the intermediate film layer comprises a fold line, and the fold line intersects with the inner layer portion and the outer layer portion of the frame sealing glue body at folding points.

In one possible embodiment, the frame sealing glue body is formed from an ultraviolet-curable glue.

In one possible embodiment, a thickness of the intermediate film layer is equal to a thickness of the inner layer portion or the outer layer portion of the frame sealing glue body.

In one possible embodiment, the intermediate film layer forms a continuous curve line.

In one possible embodiment, the intermediate film layer forms a discontinuous curve line.

In one possible embodiment, the intermediate film layer is disconnected at a corner of an enclosed frame formed by the frame sealing glue.

In one possible embodiment, the intermediate film layer is disconnected at a side edge of an enclosed frame formed by the frame sealing glue.

In one possible embodiment, the intermediate film layer forms a non-smooth fold line.

Accordingly, in an embodiment of the present disclosure, there is further provided a display panel, comprising a first substrate and a second substrate opposite to the first substrate, wherein the display panel further comprises the above-described frame sealing glue, and the frame sealing glue is disposed between the first substrate and the second substrate.

In one possible embodiment, an organic light emitting diode is provided in a region enclosed by the frame sealing glue on the first substrate or the second substrate.

Accordingly, in an embodiment of the present disclosure, there is further provided a display device, comprising the above-described display panel.

DETAILED DESCRIPTION OF PREFERRED EMBODIMENTS

The technical solutions of the embodiments of the present disclosure will now be clearly and fully described in conjunction with the accompanying drawings in the embodiments of the present disclosure. It will be apparent that the described embodiments are merely a part of the present disclosure and do not represent all of the embodiments of the present disclosure. All other embodiments obtained by those skilled in the art based on the embodiments of the present disclosure without creative work will fall within the scope of the present disclosure.

Figure 1:
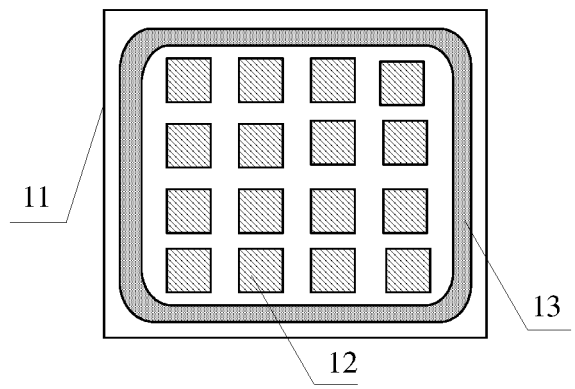
FIG. 1 is a schematic structural view of a display panel.

As for the OLED display panel, a frame sealing glue having a two-layer structure and formed from an ultraviolet-curable glue may be used to implement a sealing assembly. As shown in FIG. 1, the OLED display panel includes a substrate 11, an OLED display element 12 located in a display area of the substrate and an ultraviolet-curable glue 13 located in a border area of the substrate. When the ultraviolet-curable glue having a two-layer structure is broken at any different points, it will cause the OLED device to be not airtight and external water vapor or air can enter into the display area, resulting in damage to the OLED device.

Embodiments of the present disclosure provide a frame sealing glue, a display panel and a display device so as to avoid a leakage phenomenon when the frame sealing glue is broken at different points, thereby increasing ability of the frame sealing glue to resist external atmospheric pressure.

Next, the specific frame sealing glue, the display panel and the display device according to the embodiments of the present disclosure will be described in detail with reference to the accompanying drawings.

In the drawings, a thickness and size of each film layer does not represent a true scale of the frame sealing glue, and what it shows is merely illustrative of the contents of the present disclosure.

Figure 2:
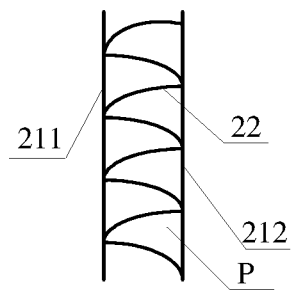
FIG. 2 is a schematic structural view of a frame sealing glue according to an embodiment of the present disclosure.

Referring to FIG. 2, a frame sealing glue 3 according to an embodiment of the present disclosure includes a frame sealing glue body having two-layer structure of an inner layer portion and an outer layer portion (specifically, the frame sealing glue body includes an inner layer portion 211 and an outer layer portion 212 shown in FIG. 2), and further includes an intermediate film layer 22 disposed between the two-layer structure of the inner layer portion 211 and the outer layer portion 212, and a plurality of enclosed spaces P are formed by the intermediate film layer 22 and the inner layer portion 211 and the outer layer portion 212 of the frame sealing glue body.

FIG. 2 is a top view of the frame sealing glue coated on a base substrate. The shape of the frame sealing glue in FIG. 2 only represents a shape of the frame sealing glue formed during a coating process, and the thickness of the frame sealing glue is not specifically limited herein.

It should be noted that the inner layer portion 211 and the outer layer portion 212 of the frame sealing glue body in the embodiment of the present disclosure are intended to distinguish two layers of the frame sealing glue body having the two-layer structure, and it is not limited that a left portion of the frame sealing glue body in FIG. 2 is the inner layer portion and a right portion of the frame sealing glue body is the outer layer portion. Alternatively, the left portion of the frame sealing glue body may be the outer layer portion and the right portion of the frame sealing glue body may be the inner layer portion. Optionally, the frame sealing glue body having a two-layer structure is coated in the border area of the display panel, wherein the layer closest to the display area of the display panel is the inner layer portion, and the layer farthest from the display area of the display panel is the outer layer portion.

Figure 3A:
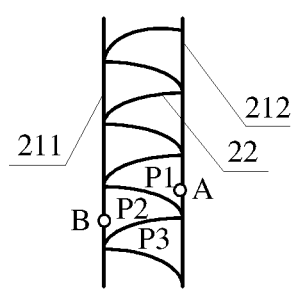
FIGS. 3a and 3b are respectively schematic effect views of the frame sealing glue according to the embodiment of the present disclosure and the frame sealing glue shown in FIG. 1 when they are broken.
Figure 3B:
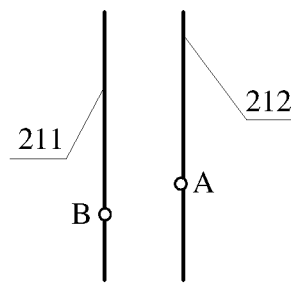

In order to further illustrate the effects of the frame sealing glue according to the embodiment of the present disclosure, the embodiment will be described in detail. Referring to FIGS. 3a and 3b, FIG. 3a is a schematic effect view of the frame sealing glue according to the embodiment of the present disclosure when it is broken, and FIG. 3b is a schematic effect view of the frame sealing glue shown in FIG. 1 when it is broken. As shown in FIG. 3a, the frame sealing glue body includes an inner layer portion 211 and an outer layer portion 212, and further includes an intermediate film layer 22 disposed between the inner layer portion and the outer layer portion. In the embodiment, a plurality of enclosed spaces are formed by the intermediate film layer 22 and the inner layer portion 211 or the outer layer portion 212 of the frame sealing glue body, wherein the enclosed spaces include P1, P2 and P3. If the frame sealing glue is broken at different points, for example, point A and point B, external air or water vapor reaches the intermediate film layer from the point A but cannot enter into the inner layer portion through the intermediate film layer, due to the blocking effect of the intermediate film layer 22. That is, the air and the water vapor at the right side of the frame sealing glue cannot spread to the left side of the frame sealing glue through the frame sealing glue. Similarly, due to the blocking effect of the intermediate film layer 22, the air or the water vapor at the left side of the point B cannot enter into the outer layer portion through the intermediate film layer, that is, the air and the water vapor at the left side of the frame sealing glue cannot spread to the right side of the frame sealing glue through the frame sealing glue.

Referring to FIG. 3b, the frame sealing glue includes an inner layer portion 211 and an outer layer portion 212. If the frame sealing glue is broken at point A and point B, it is apparent that the air and water vapor at the right side of the frame sealing glue can spread to the left side of the frame sealing glue through the frame sealing glue body.

Therefore, in the frame sealing glue according to the embodiment of the present disclosure, since an intermediate film layer is provided between the inner and outer layer portions of the frame sealing glue body, and a plurality of enclosed spaces are formed between the intermediate film layer and the inner and outer layer portions so that the air or water vapor at both sides of the frame sealing glue cannot be exchanged through the frame sealing glue, thereby improving the ability of the frame sealing glue of resisting the impact of the external atmosphere.

The frame sealing glue according to the embodiment of the present disclosure includes the frame sealing glue body having a two-layer structure of the inner layer portion and the outer layer portion and the intermediate film layer disposed between the inner layer portion and the outer layer portion, and a plurality of enclosed spaces are formed by the intermediate film layer and the inner layer portion and the outer layer portion of the frame sealing glue body. Therefore, if the frame sealing glue structure according to the embodiment of the present disclosure is broken at different points, air or water vapor at both sides of the frame sealing glue cannot pass through the frame sealing glue due to the presence of the plurality of enclosed spaces, thereby increasing the ability of the frame sealing glue of resisting the impact of the external atmosphere.

In a specific embodiment, in the frame sealing glue according to the embodiment of the present disclosure, the intermediate film layer is formed from a same material as the frame sealing glue body.

In order to further simplify the manufacturing process of the frame sealing glue, the material of the intermediate film layer may be the same as the material of the frame sealing glue body. It is possible that the intermediate film layer is made of different material from the frame sealing glue body, which also falls within the scope of the present disclosure.

In a specific embodiment, in the frame sealing glue according to the embodiment of the present disclosure, the intermediate film layer is constructed as a curved line structure, and peaks and valleys of the curved line intersect with the frame sealing glue body having a two-layer structure.

Figure 4:
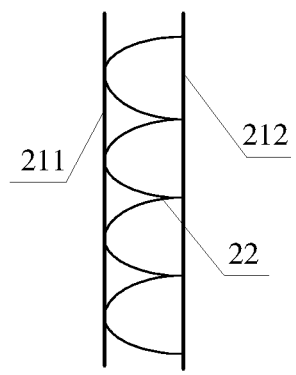
FIG. 4 is a schematic structural view of a second type of frame sealing glue according to an embodiment of the present disclosure.

Referring to FIG. 2 or FIG. 3a, the structure of the intermediate film layer may be designed to be a curved line. For example, referring to FIG. 4, the structure of the intermediate film layer 22 may be constructed as a structure having a plurality of semicircular curved lines.

Figure 5:
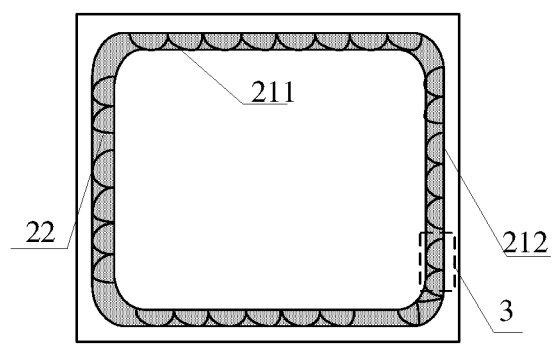
FIG. 5 is a schematic structural view of a display panel comprising a third type of frame sealing glue according to an embodiment of the present disclosure.

It should be noted that the intermediate film layer 22 may form a continuous curved line structure, or alternatively, a discontinuous curved line structure. As shown in FIG. 5, the intermediate film layer 22 forms a discontinuous curved line structure, the frame sealing glue 3 is located in a border area of the display panel, and the frame sealing glue 3 includes an inner layer portion 211, an outer layer portion 212 and an intermediate film layer 22, and the intermediate film layer 22 forms a curved line structure and the peaks and valleys of the curve line intersect with the frame sealing glue body having a two-layer structure to form a plurality of enclosed spaces.

In a specific embodiment, the intermediate film layer 22 is disconnected at a corner of an enclosed frame formed by the frame sealing glue 3, or alternatively, the intermediate film layer 22 is disconnected at a side edge of the enclosed frame formed by the frame sealing glue, as shown in FIG. 5.

It should be noted that the peaks and valleys of the curved line intersect with the inner and outer layer portions of the frame sealing glue body so that a plurality of enclosed spaces are formed by the curved line of the intermediate film layer and the inner layer portion 211 and the outer layer portion 212. The enclosed spaces are used to block the air and the water vapor at both sides of the frame sealing glue from being exchanged, thereby improving the ability of the frame sealing glue for resisting the external pressure.

Figure 6:
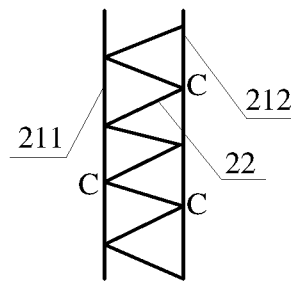
FIG. 6 is a schematic structural view of a fourth type of frame sealing glue according to an embodiment of the present disclosure.

In a specific embodiment, in the frame sealing glue according to the embodiment of the present disclosure, as shown in FIG. 6, the intermediate film layer 22 includes a fold line structure, and the fold line intersects with the inner layer portion 211 and the outer layer portion 212 of the frame sealing glue body at folding points C. Since the fold line intersects with the inner layer portion and the outer layer portion of the frame sealing glue body at the folding points, a plurality of enclosed spaces are formed by the fold line of the intermediate film layer and the inner layer portion and the outer layer portion.

Figure 7:
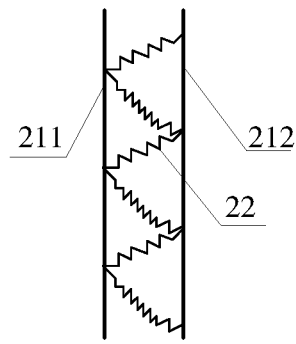
FIG. 7 is a schematic structural view of a fifth type of frame sealing glue according to an embodiment of the present disclosure.

Specifically, if the intermediate film layer forms a fold line, it is also possible to adopt the form shown in FIG. 7, i.e., a non-smooth fold line. The form of the fold line will not be specifically limited.

It should be noted that, if the intermediate film layer forms a fold line, it is not intended to limit the included angle between the fold line and the inner layer portion or the outer layer portion, and it is not intended to limit the length of the fold line.

In a specific embodiment, in the frame sealing glue according to the embodiment of the present disclosure, the frame sealing glue body is formed from an ultraviolet-curable glue.

Specifically, when a display element of a photovoltaic device, a plasma display, an organic light emitting diode, or an active-matrix organic light emitting diode (AMOLED) is sealed, an ultraviolet-curable glue is generally used for sealing. The ultraviolet-curable glue has advantages such as fast curing, low energy consumption and non-solvent pollution, therefore it is a new type of energy-saving and environmentally friendly adhesive. The ultraviolet-curable glue refers to that: under irradiation of ultraviolet light having an appropriate wavelength and light intensity, photoinitiator in the adhesive rapidly decomposes into free radicals or cations, and then it causes unsaturated bonds to polymerize so that the material cures. For the display panels of different materials, different materials may be used for frame sealing glue during implementing the sealing assembly, and it is not intended to limit the materials of the frame sealing glue in the embodiments of the present disclosure.

In a specific embodiment, in the frame sealing glue according to the embodiment of the present disclosure, a thickness of the intermediate film layer is equal to a thickness of the inner layer portion or the outer layer portion of the frame sealing glue body.

Specifically, the thickness of the intermediate film layer may be designed to be 2 microns to 3 microns, or equal to the thickness of the inner layer portion of the frame sealing glue body or equal to the thickness of the outer layer portion of the frame sealing glue body. However, it is not intended to limit the thickness of the intermediate film layer herein.

Figure 8:
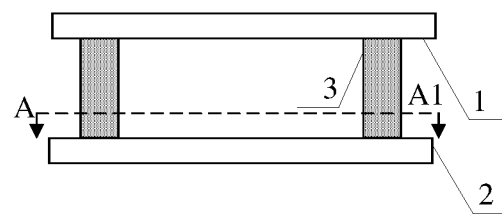
FIG. 8 is a schematic structural view of a display panel according to an embodiment of the present disclosure.

Accordingly, in an embodiment of the present disclosure, as shown in FIG. 8, there is further provided a display panel, including a first substrate 1 and a second substrate 2 opposite to the first substrate, wherein the display panel further includes the frame sealing glue according to any one of embodiments of the present disclosure, and the frame sealing glue is disposed between the first substrate 1 and the second substrate 2.

Figure 9:
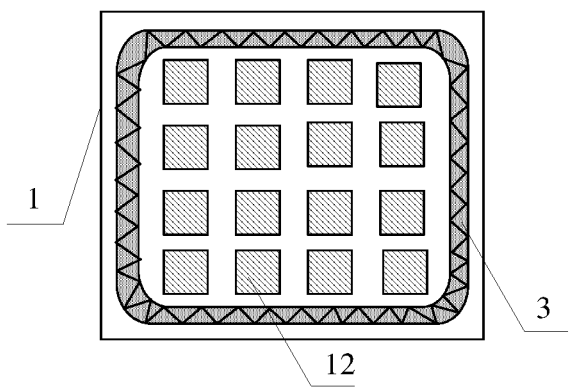
FIG. 9 is a cross sectional view taken along A-A1 of FIG. 8.

In a specific embodiment, in the display panel according to the embodiment of the present disclosure, as shown in FIG. 9, which is a cross sectional view taken along A-A1 of FIG. 8, an organic light emitting diode 12 is provided in a region enclosed by the frame sealing glue 3 on the first substrate 1 or the second substrate 2.

If the frame sealing glue according to the embodiment of the present disclosure is broken at different points, air or water vapor at both sides of the frame sealing glue cannot pass through the frame sealing glue due to the presence of the plurality of enclosed spaces, thereby increasing the ability of the frame sealing glue of resisting the impact of the external atmosphere. Thus, as for the display panel having a display element composed of organic light emitting diodes, since it is coated with the frame sealing glue according to the embodiment of the present disclosure, leakage phenomenon is avoided in the display element, thereby reducing damage rate of the display element, and improving coefficient of utilization of the display panel.

Accordingly, in an embodiment of the present disclosure, there is further provided a display device, including the display panel according to any one of the embodiments of the present disclosure. The display device may be any one of products or components having a display function, such as a notebook computer display, an electronic paper, an organic light emitting diode display, a liquid crystal display, a liquid crystal television, a digital photo frame, a mobile phone, a tablet computer or the like.

In the embodiments of the present disclosure, there are provided a frame sealing glue, a display panel and a display device. The frame sealing glue includes a frame sealing glue body, having an inner layer portion and an outer layer portion, and an intermediate film layer disposed between the inner layer portion and the outer layer portion, and a plurality of enclosed spaces are formed by the intermediate film layer and the inner layer portion and the outer layer portion of the frame sealing glue body. Therefore, if the frame sealing glue according to the embodiment of the present disclosure is broken at different points, air or water vapor at both sides of the frame sealing glue cannot pass through the frame sealing glue due to the presence of the plurality of enclosed spaces, thereby increasing the ability of the frame sealing glue of resisting the impact of the external atmosphere.

It will be apparent that various variations and modifications may be made to the present disclosure by those skilled in the art without departing from the spirit and scope of the present disclosure. Thus, it is intended to contain such variations and modifications in the present disclosure if these variations and modifications fall within the scope of the claims of the present disclosure and the equivalents thereof.

What is claimed is:

1. A frame sealing glue, comprising:
   a frame sealing glue body having an inner layer portion and an outer layer portion; and
   an intermediate film layer disposed between the inner layer portion and the outer layer portion;
   wherein a plurality of enclosed spaces are formed by the intermediate film layer and the inner layer portion or the outer layer portion of the frame sealing glue body,
   wherein the intermediate film layer comprises a wave-shaped curved line having a plurality of semicircular curved line portions, the wave-shaped curved line forming a discontinuous curved line such that the intermediate film layer is disconnected at a corner of an enclosed frame formed by the frame sealing glue,
   wherein a peak and a valley of the wave-shaped curved line intersect with the inner layer portion and the outer layer portion of the frame sealing glue body, respectively, or with the outer layer portion and the inner layer portion of the frame sealing glue body, respectively,
   wherein each of the inner layer portion and the outer layer portion is a continuous closed line, and
   wherein the intermediate film layer is made of different material from the frame sealing glue body.

2. The frame sealing glue according to claim 1, wherein the frame sealing glue body is formed from an ultraviolet-curable glue.

3. The frame sealing glue according to claim 1, wherein a thickness of the intermediate film layer is equal to a thickness of the inner layer portion or the outer layer portion of the frame sealing glue body.

4. A display panel, comprising a first substrate and a second substrate opposite to the first substrate, wherein the display panel further comprises the frame sealing glue according to claim 1, and the frame sealing glue is disposed between the first substrate and the second substrate.

5. The display panel according to claim 4, wherein an organic light emitting diode is provided in a region enclosed by the frame sealing glue on the first substrate or the second substrate.

6. A display device, comprising the display panel according to claim 4.

* * * * *